United States Patent [19]

Michon

[11] Patent Number: 5,373,295
[45] Date of Patent: Dec. 13, 1994

[54] DIGITAL INTERFACE CIRCUIT FOR HIGH DYNAMIC RANGE ANALOG SENSORS

[75] Inventor: Gerald J. Michon, Waterford, N.Y.

[73] Assignee: General Electric Company, Schenectady, N.Y.

[21] Appl. No.: 939,333

[22] Filed: Sep. 2, 1992

[51] Int. Cl.$^5$ .......................... H03M 1/36; H03M 1/38
[52] U.S. Cl. ............................... 341/159; 341/158; 341/165; 341/155
[58] Field of Search ............... 341/159, 158, 155, 165, 341/161–164

[56] References Cited

U.S. PATENT DOCUMENTS 4,807,038 2/1989 Michon ............................ 358/213.31
5,140,326 8/1992 Bacrania et al. ..................... 341/159

Primary Examiner—Sharon D. Logan
Attorney, Agent, or Firm—Marvin Snyder

[57] ABSTRACT

An output circuit for use with an array of high dynamic range analog sensor produces a digital output signal from the array prior to multiplexing, so as to avoid analog multiplexing noise. The analog signals are converted to digital form using a simple, parallel analog-to-digital conversion process at the outputs of low noise array amplifiers. By latching the converted digital output signals into shift registers, the analog multiplex function is obviated and the full dynamic range capability of the detector-amplifier combination is made available.

11 Claims, 2 Drawing Sheets

DIGITAL INTERFACE CIRCUIT FOR HIGH DYNAMIC RANGE ANALOG SENSORS

BACKGROUND OF THE INVENTION

1. Field of the Invention

This invention relates to techniques for improving the dynamic range of analog sensing arrays and, more particularly, to a digital interface circuit which avoids the noise produced by analog multiplexing circuitry used to sample individual detectors in a sensing array.

2. Description of the Prior Art

In employing wide dynamic range analog detector arrays (both linear and area arrays) for detecting patterns of energy impinging thereon, direct sensing of the detector outputs conventionally requires analog multiplex circuitry to sample the individual detectors in the array. This analog multiplex circuitry has limited dynamic range, and often introduces Johnson noise and switching noise. The dynamic range of this analog multiplex circuitry is usually significantly lower than the dynamic range of the detectors being sensed and, consequently, limits system dynamic range. Introduction of amplifiers ahead of the multiplex circuitry improves performance, but the full dynamic range of the detector-amplifier combination is still not available.

One-dimensional (linear) and two-dimensional (area) image detector arrays have been developed using photodiode, charge injection device (CID), and charge coupled device (CCD) technology. The signals produced by the detectors in these arrays are delivered to one or more output nodes using some type of analog multiplexer, usually comprised of either switches or charge transfer devices. The limit on system performance imposed by the multiplexer is a result of the capacitance load of the multiplexer circuitry, Johnson noise introduced by the sampling function, switching interference, or, in the case of charge transfer, the introduction of charge transfer losses and charge transfer noise.

The technical literature is replete with descriptions of image detector arrays employing amplifiers ahead of analog multiplex circuitry for sampling individual detectors of the arrays. For example, in G. J. Michon U.S. Pat. No. 4,807,038, issued Feb. 21, 1989 and assigned to the instant assignee, low noise, wide dynamic range amplifiers are integrated with the sensing array prior to the analog multiplex function. The Michon apparatus has been designed with particular care to include a low noise, wide dynamic range analog multiplexer following the amplifiers; however, in the resulting sensor system, which has a dynamic range in excess of 60 dB, the dynamic range (and readout rate) remains limited by noise introduced by the analog multiplexer.

SUMMARY OF THE INVENTION

It is therefore an object of the present invention to make available the full dynamic range capability of high dynamic range detector arrays.

Another object of the invention is to avoid the noise associated with use of analog multiplex circuitry in detector arrays.

Since the high dynamic range sensing of analog signals from various arrays of detectors is often limited in performance by the multiplex circuitry, the general approach of the present invention is to convert the analog signals to digital form before multiplexing to an output node or nodes. This is done as early in the signal processing path as is reasonable to minimize the introduction of noise and/or interference. By introducing simple, parallel analog-to-digital (A/D) conversion at the output of low noise array amplifiers, and using digital shift registers to avoid the analog multiplex function, the full dynamic range of the detector-amplifier combination is made available.

Briefly, in accordance with a preferred embodiment of the invention, a detection system having an array of high dynamic range analog sensors includes an output circuit for generating a digital output signal having a comparably high dynamic range. The output circuit comprises amplifying means for amplifying the analog output signals of the sensors, analog-to-digital conversion means for converting the amplified analog output signals of the amplifying means to digital output signals, and accumulating means for accumulating the digital output signals as an indication of energy patterns impinging on the array.

BRIEF DESCRIPTION OF THE DRAWINGS

The foregoing and other objects, aspects and advantages will be better understood from the following detailed description of a preferred embodiment of the invention with reference no the drawings, in which.

DETAILED DESCRIPTION OF A PREFERRED EMBODIMENT OF THE INVENTION

Figure 1:
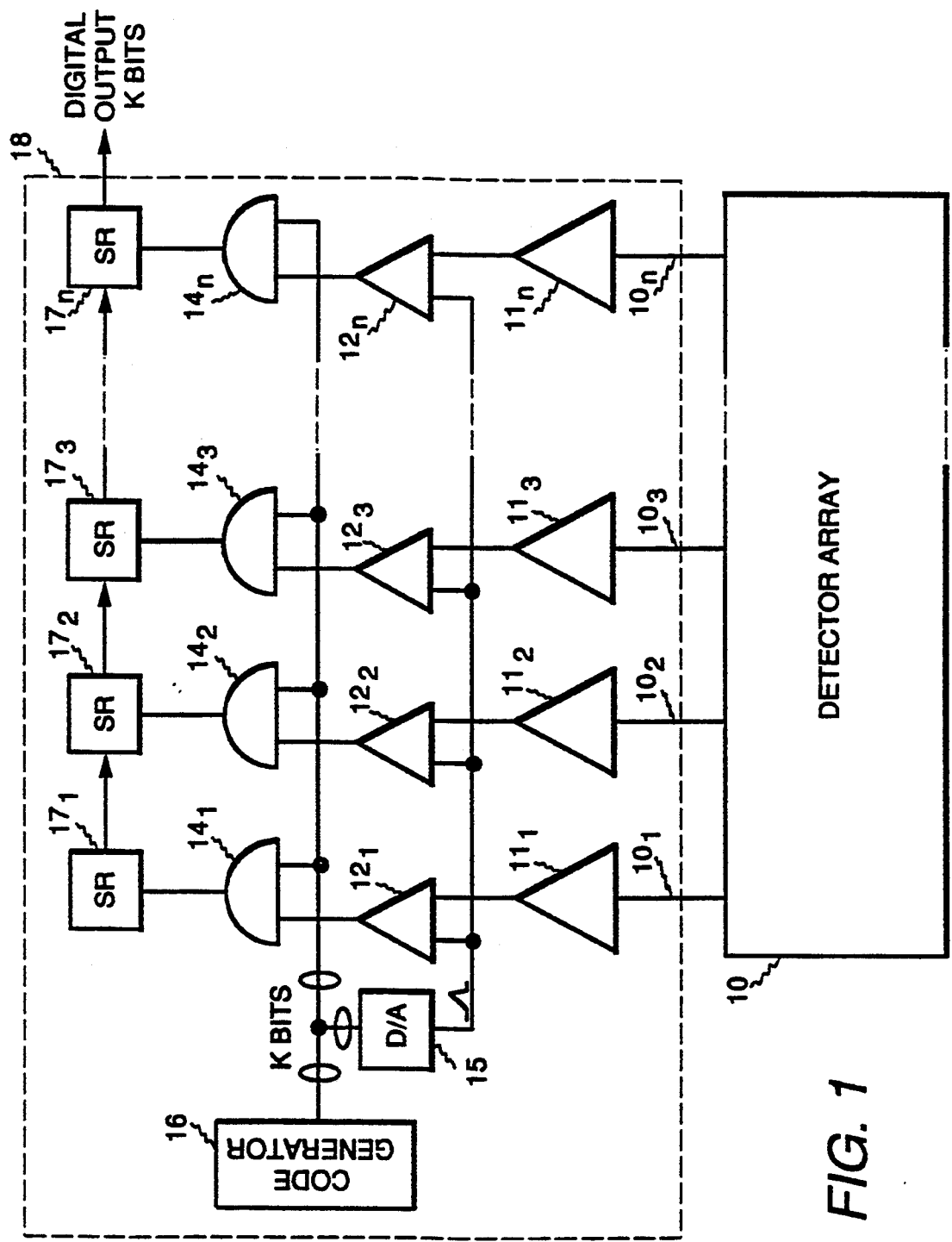
FIG. 1 is a block diagram of system architecture according to a preferred embodiment of the invention.

FIG. 1 illustrates the system architecture of the present invention. A high dynamic range detector array 10 generates a plurality of output signals $10_1$, $10_2$, $10_3$, . . . , $10_n$ in accordance with the pattern of energy impinging on the array. Detector array 10 can be a linear or area array of diode, CID, or CCD photon detectors, or an array of other than photon detectors. Each of the output signals of the array is supplied to an output circuit 18 where it is separately amplified by a corresponding amplifier $11_1$, $11_2$, $11_3$, . . . , $11_n$, and each of the amplified output signals, respectively, is supplied as one of the input signals to a respective one of comparators $12_1$, $12_2$, $12_3$, . . . , $12_n$. A reference or second input signal in the form of a ramping analog voltage is supplied to each of the comparators by a digital-to-analog (D/A) converter 15 and as illustrated by the ramp voltage waveform shown at the output of the D/A converter. Each of comparators $12_1$ to $12_n$ senses the point where the ramping analog input voltage equals the output voltage of the respective amplifier coupled thereto. At the point in time where the ramping analog input voltage of any given comparator equals the output voltage of the respective amplifier coupled thereto, the given comparator supplies a gating output pulse to the corresponding one of AND gates $14_1$, $14_2$, $14_3$, . . . , $14_n$.

The ramping analog input voltage is generated by (D/A) converter 15 in response to a progressively increasing digital count from a code generator 16. The number of bits in the code is K bits, where K is typically a multiple of eight. Thus, for K=8, there are eight conductive output lines from code generator 16 to D/A converter 15. These same output lines are also supplied to each of AND gates $14_1$ to $14_n$. Thus the digital code from code generator 16 is applied to the AND gates simultaneously with the output signals from the respective comparators. When the analog voltage ramp equals an amplifier output signal amplitude, the comparator coupled to that amplifier switches and gates on the AND gate coupled thereto. When any one of the AND gates is thus gated on by a pulse from its corresponding comparator coupled thereto, the digital code generated at that moment in time is latched into a corresponding one of shift register stages $17_1$, $17_2$, $17_3$, ..., $17_n$ for subsequent readout. This operation is performed for each of the amplifiers, in parallel. Once the analog voltage ramp has completed its full excursion, the digital data in the shift register stages is transferred to the output thereof.

Code generator 16 can be a simple linear counter or it can be nonlinear. One nonlinear code for use in the invention could be that which results from making the sweep step size equal to the shot noise in the amplifier output signal; i.e., the sweep step size would be proportional to the square root of the signal level. This would result in a minimum code width (number of bits) for encoding all of the available information.

Code generator 16 and D/A converter 15 can be implemented separately or be separable electrically from the sensing system to allow offset and gain measurements to be made for subsequent correction. A second, smaller shift register (not shown) could be added to allow measurement of sensor reset Johnson noise, which could thereupon be subtracted from the signal data upon readout. In some applications, a respective sample-and-hold circuit may be needed between each respective amplifier and the respective comparator coupled thereto to allow A/D conversion and readout to proceed on the "held" data in output circuit 18 while the next line of data in the array is integrated and amplified.

The amplifiers $11_1$ to $11_n$ can be voltage amplifiers as described in the aforementioned U.S. Pat. No. 4,807,038, or they can be charge sensitive amplifiers of the type illustrated in FIG. 2. The amplifier shown in FIG. 2 is implemented using metal oxide semiconductor field effect transistor (MOSFET) technology and is therefore compatible with CID and CCD technology that may used in detector array 10.

Figure 2:
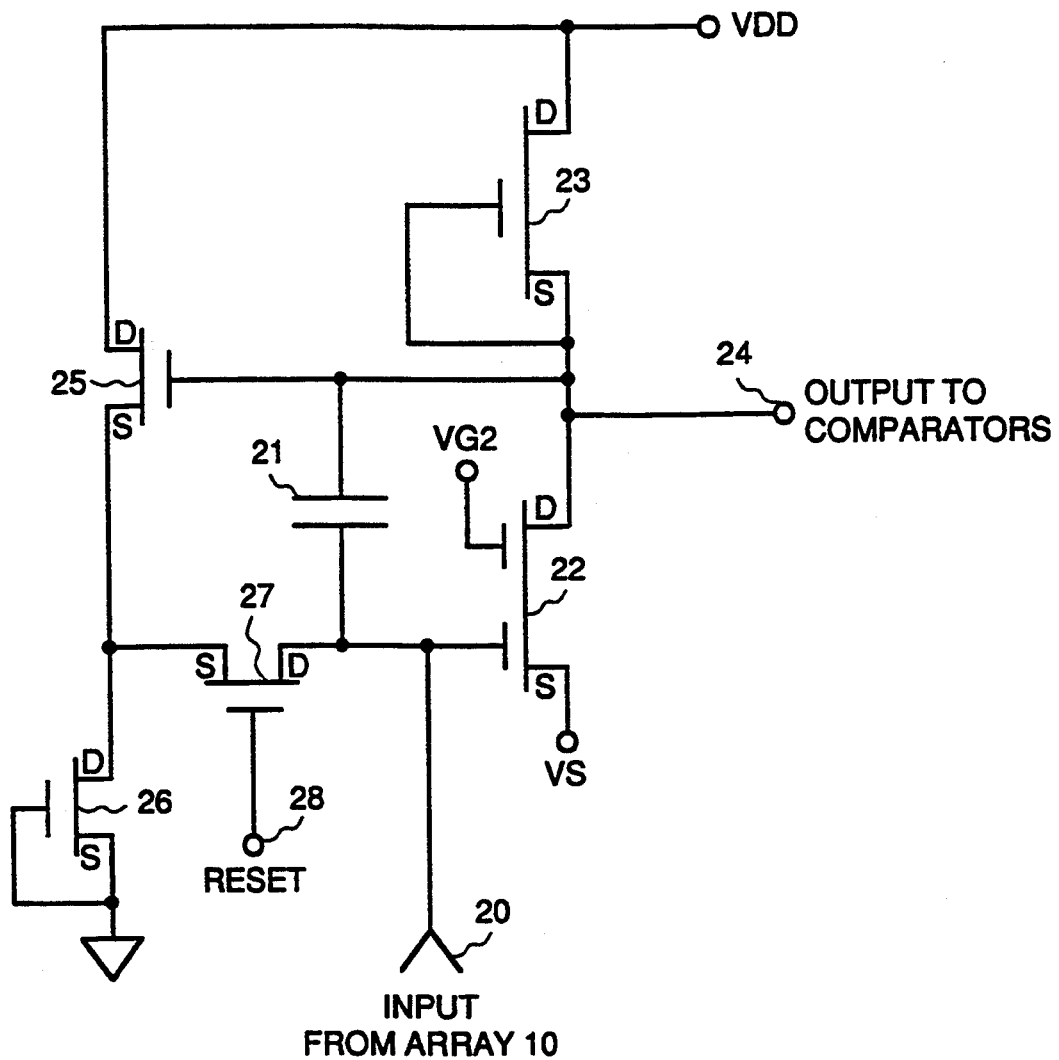
FIG. 2 is a schematic diagram of a charge sensitive amplifier which may be used in the system shown in FIG. 1.

With particular reference to FIG. 2, the input signal from detector array 10 is supplied on input terminal 20 to one side of a capacitor 21 and to one of the gates of a dual gate enhancement mode FET 22. The second gate of FET 22 is connected to a d.c. bias voltage VG2. The source electrode of FET 22 is connected to a bias voltage source VS, which is a threshold voltage of lower amplitude than the detector array bias voltage, and the drain electrode connected to a voltage source VDD through a depletion mode FET 23. Depletion mode FET 23 is conductive, having its gate electrode connected to its source electrode.

The drain electrode of FET 22 is connected output terminal 24, to the other side of capacitor 21, to the source electrode of FET 23, and to the gate of FET 25 having its drain electrode connected to the source of voltage VDD. The source electrode of FET 25 is connected to the drain electrode of a depletion mode FET 26 which is conductive in that it has both its source electrode and gate electrode connected to ground. An FET 27 has its source electrode connected to the common connection of the source electrode of FET 25 and the drain electrode of FET 26 and has its drain electrode connected to the common connection of the input terminal 20, capacitor 21 and the first gate of FET 22. The gate of FET 27 is connected to a reset terminal 28.

The amplifier operates by first being reset by application of a pulse to terminal 28 to discharge capacitor 21 through FETs 27 and 26. After completion of the reset pulse, the amplifier integrates the output charge from the detector array by building up a charge on capacitor 21 in accordance with a time constant determined by capacitor 21 and the resistance of FET 23. This amplifier can be implemented with n-channel or p-channel FETs or, with modification, CMOS FETs.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described my invention, what I claim as new and desire to secure by Letters Patent is as follows:

1. In a detection system having an array of high dynamic range analog sensors, an output circuit for generating a digital output signal having a comparably high dynamic range, comprising:
   amplifying means for amplifying the analog output signals of said sensors;
   analog-to-digital conversion means for converting the amplified analog output signals of said amplifying means to digital output signals; and
   accumulating means for accumulating said digital output signals as an indication of energy patterns impinging on said array.

2. The apparatus of claim 1 wherein said analog-to-digital conversion means is directly coupled to the output of said amplifying means in the signal processing path so as to minimize introduction of noise and interference.

3. The apparatus of claim 1 wherein said amplifying means comprises charge sensitive amplifiers.

4. The apparatus of claim 1 wherein said analog-to-digital conversion means comprises:
   code generator means for generating a digital code;
   digital-to-analog conversion means for converting said digital code to an analog signal representative thereof; and
   comparator means for comparing said representative analog signal to each of the output signals of said amplifying means and producing a gating pulse whenever said representative analog signal equals the amplitude of an output signal from said amplifying means.

5. The apparatus of claim 4 wherein said code generator means comprises a linear counter.

6. The apparatus of claim 4 wherein said code generator means comprises a nonlinear code generator.

7. The apparatus of claim 6 wherein said nonlinear code generator comprises means for producing a code having a step size equal to shot noise in the output signal produced by said amplifying means.

8. The apparatus of claim 4 wherein said accumulating means comprises:
   shift register means for receiving digital codes; and
   means for gating a digital code from said digital code generator to said shift registers when said comparing means detects that said representative analog signal is equal to an output signal of said amplifying means.

9. The apparatus of claim 1 wherein said analog sensors comprise charge injection device image sensors and said amplifying means comprises charge sensitive amplifiers.

10. The apparatus of claim 1 wherein said analog sensors comprise charge coupled device image sensors and said amplifying means comprises charge sensitive amplifiers.

11. The apparatus of claim 3 wherein each of said charge sensitive amplifiers comprises:

a capacitor;

a depletion mode metal oxide semiconductor field effect transistor (MOSFET) connected in series with said capacitor to form a charging path therefor, said MOSFET being connected in a conductive configuration; and a reset MOSFET for coupling said capacitor to ground upon application of a signal to a gate electrode thereof.

* * * * *